United States Patent [19]

Kakihama et al.

[11] 3,884,698

[45] May 20, 1975

[54] METHOD FOR ACHIEVING UNIFORM EXPOSURE IN A PHOTOSENSITIVE MATERIAL ON A SEMICONDUCTOR WAFER

[75] Inventors: Sanehiko Kakihama; Edward B. Stoneham, both of Los Altos, Calif.

[73] Assignee: Hewlett-Packard Company, Palo Alto, Calif.

[22] Filed: Aug. 23, 1972

[21] Appl. No.: 283,143

[52] U.S. Cl. ............... 117/217; 117/71 R; 117/218; 117/33.3

[51] Int. Cl. ............................ B44d 1/16; B44d 1/18

[58] Field of Search ............ 117/218, 217, 33.3, 34, 117/212, 33.5, 71 R; 96/36.2, 38.3, 84 R, 86 R

[56] References Cited

UNITED STATES PATENTS 3,567,506 3/1971 Belardi ................................ 96/36.2

OTHER PUBLICATIONS

Hass et al. Optical Properties of Metals. In American Institute of Physics Handbook, 2nd Edition. McGraw-Hill, New York. 1963 pages 6–103 to 6–118.

Khoury et al. Anti-Interference Phenomena Coating. In IBM Technical Disclosure Bulletin. 13(1):p.38. June 1970.

*Primary Examiner*—Cameron K. Weiffenbach
*Attorney, Agent, or Firm*—Ronald E. Grubman

[57] ABSTRACT

A method of fabricating semiconductor devices on a wafer, in which an antireflection layer is interposed between a layer of insulating material and a photosensitive layer. The use of this antireflection layer allows suppression of the optical interference between an incident light wave and a light wave that is ordinarily reflected back into the photosensitive layer. Also, this layer provides a surface to which a positive photoresist material generally used as the photosensitive layer will adhere tenaciously.

3 Claims, 3 Drawing Figures

METHOD FOR ACHIEVING UNIFORM EXPOSURE IN A PHOTOSENSITIVE MATERIAL ON A SEMICONDUCTOR WAFER

BACKGROUND OF THE INVENTION

Modern methods of producing miniaturized semiconductor devices involve many stages of layering and etching on a wafer of suitable material. As the lateral dimensions of the devices have decreased, severe difficulties have been encountered with the standard masking methods for defining the areas of the wafer to be etched. The usual method of defining these areas consists of superimposing a layer of photosensitive material, such as a positive or negative photoresist, on the wafer, and then exposing selected areas of the photoresist to light. In the case of commercially available negative photoresist materials, such as KTFR, the exposed areas become insoluble in a developer while the unexposed areas dissolve. In the case of commercially available positive photoresist materials, such as AZ–1350, the exposed areas will wash off in a developer, while the unexposed areas remain. In either case, the photoresist remaining on the wafer forms a pattern for subsequent etching of an insulating layer, for instance an oxide, below the photoresist layer. The pattern should be a faithful reproduction of an original pattern, the original having been transferred to the photoresist from a mask on which the pattern was imprinted.

In one method for transferring the pattern, called contact mask printing, the mask and wafer are brought into intimate contact to align their adjacent surfaces in parallel planes relative to each other. The two are then separated slightly and moved relative to each other to align the mask pattern to the pattern on the surface of the photoresist by viewing the mask and wafer through a microscope. The mask and wafer are then brought back into contact and illuminated by a light source to expose the photoresist. A major difficulty in using this method for producing devices whose smallest dimension is less than 1.0 micron is that the illuminating light defracts through the pattern defining slits on the mask, so that the images of the slits on the photoresist are wider than the actual slits on the mask. Moreover, the width of the slit images is nonuniform since the amount of spreading of the beam depends on the thickness of the residual thin air film between the mask and the photoresist, which thickness may vary slightly from place to place on the wafer. Additional problems arise from the wear and tear on both the mask and the wafer as a result of the physical contact between them.

To surmount these problems, a newer process called projection mask printing has been introduced, in which the mask does not come into contact with the wafer. Instead, the illuminating light first passes through the mask and then is directed through a lens system which functions as an inverse microscope, reducing the image of the mask by a certain factor, for instance a factor of ten. The image is then projected onto the wafer, where the photoresist is exposed and the pattern reproduced. Alignment is again done optically, problems of lens resolution being mitigated by stepping the microscope so that sites of small dimension on the wafer are aligned and exposed sequentially. The field of view of each site is then small enough to ensure that the inverse microscope has adequate resolution.

But the use of this projection printing process introduces problems originating in a requirement that the exposing light be monochromatic, which in turn requires that the photosensitive material exposed by the light be a positive photoresist material.

These requirements come about because the lens system used to reduce the size of the image must be able to resolve one-micron widths in a large field. This can be done economically only if the system is designed for monochromatic light. Now, it is well known that although monochromatic light will expose positive photoresist properly, it will not do as well for negative photoresist. The projection mask printing process thus also requires the use of a positive photoresist such as AZ–1350.

An understanding of the problems of the prior art which result from the requirements mentioned above can best be had by reference to FIG. 1, which shows a cross-section of a typical wafer on which semiconductor devices are to be fabricated. The layer 1 is a substrate of a semiconductor material such as silicon, on which is deposited a layer of an insulating material 2, for example an oxide. A layer of photosensitive material 3 is deposited onto the insulating layer 2.

The arrow labeled I represents monochromatic exposing light incident on the wafer after having passed through a mask and an inverse microscope (not shown) that reduces the image in size, and focuses it on the wafer. The light wave I passes through the layer of photosensitive material 3 and into the insulating layer 2, there being usually little reflection at their boundary since the index of refraction of the photosensitive material is very close to the index of refraction of the insulating material. After passing through the insulating layer, a fraction of the light, represented by $I_1$, is reflected at the boundary between the insulating layer and the substrate 1, that fraction then being transmitted back through the insulating layer into the photosensitive layer. In general these waves, I and $I_1$, will undergo optical interference in the photosensitive layer producing a standing wave with nodes of minimum exposure and antinodes of maximum exposure distributed within the photosensitive material. If the intensity of the incident light is such as to give the correct exposure at the antinodes, then the regions of material in the vicinity of the nodes will be underexposed. The result will be that upon development the photosensitive layer will not be completely opened up to permit the etching of the insulating layer. On the other hand, if the intensity of the light is increased in order to completely expose the nodes and thus open up the photosensitive material, then the areas in the vicinity of the antinodes will be overexposed, resulting in poor pattern definition on the wafer. Either of the above consequences of the optical interference in the photosensitive layer is unacceptable for one micron work.

An additional problem in the prior art of FIG. 1 is that the commerically available positive photoresist material, which must be used to achieve good exposure from the monochromatic light used in the projection mask alignment process, adheres very poorly to the materials which are suitable for use in the insulating layer.

SUMMARY OF THE INVENTION

Accordingly, it is an object of the method disclosed in the present application to reduce the amplitude of the standing waves causing non-uniform exposure through the photoresist. It is another object of the method described herein to provide a secure way of affixing the photoresist to the oxide layer.

These objects are achieved in accordance with the illustrated embodiments of the present method by interposing between the photosensitive layer and the insulating layer, a layer of material such as a metal, for example molybdenum, to which the photoresist adheres well, and which can also be used to eliminate the reflected wave in the photosensitive region. The metal layer is deposited onto the oxide using well known procedures, such as sputtering and then the photoresist layer is deposited on the metal, to which it adheres tenaciously.

In accordance with one embodiment of the invention, a thin layer of metal is deposited which transmits enough light so that the light reflected from the oxide-substrate boundary and transmitted back through the metal into the photoresist will cancel the light reflected directly from the metal back into the photoresist, provided that the various reflections differ in phase by 180 °. The thickness of the oxide layer is chosen so that the reflected waves have the appropriate phase relationship, and then the thickness of the metal layer is chosen to transmit the appropriate fraction of light to achieve complete cancellation of the reflected waves in the photoresist.

In accordance with another embodiment of the invention, a thick layer of a metal with low reflectance is deposited on the oxide, so that only a small fraction of the light incident on the metal is reflected back into the photoresist. This procedure does not completely obviate the problem of nonuniform exposure, but it does substantially improve the uniformity. Since the results do not depend on the thickness of the oxide layer, it can be used in cases where it is difficult to control the thickness of the oxide.

DETAILED DESCRIPTION OF THE PREFERRED EMBODIMENTS

Figure 1:
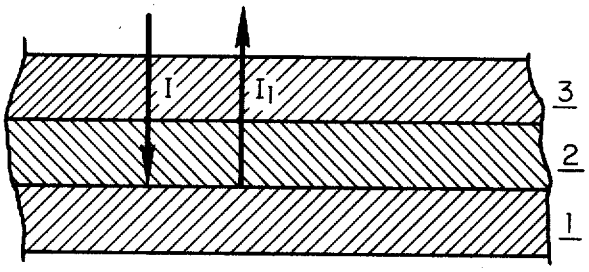
(PRIOR ART) Figure 1
FIG. 1 is a cross-sectional view illustrating the prior art, and has been already referred to in the discussion above.
Figure 2:
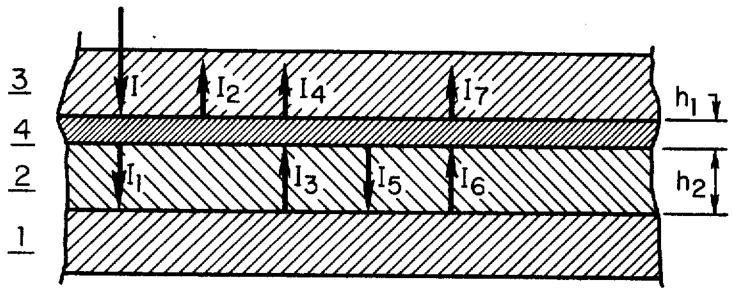
FIG. 2 is a cross-sectional view illustrating a preferred embodiment of the present invention, in which an antireflection layer is used to generate reflected light waves which cancel each other in the photosensitive layer

Referring to FIG. 2, the layer 1 is a wafer of a suitable semiconducting material such as silicon. Some other materials which might be used are germanium, gallium arsenide, tantalum nitride, molybdenum, or epitaxially grown germanium on gallium arsenide. An insulating layer 2, of a material such as silicon dioxide ($SiO_2$), sputtered quartz, silicon nitride ($Si_3N_4$), aluminum oxide ($Al_2O_3$) or silicon monoxide (SiO) is deposited onto the substrate as in the prior art. The region 4 which we call an antireflection layer consists of one or more solid materials, for example molybdenum, chromium, gold, nickel, or tantalum nitride. A layer of photosensitive material 3 as used in the prior art is deposited onto the antireflection layer 4. By suitably choosing the thickness of the antireflection layer 4 and also the thickness of the layer of insulating material 2 lying below it, it is possible to prevent any light from being reflected back into the photosensitive layer, and hence to eliminate optical interference and the resulting standing wave in the photoresist layer which was present in the prior art. At the same time it is possible to choose the material of this antireflecting layer so that the photoresist will adhere to it tenaciously, eliminating the non-stick problem associated with the prior art.

The arrow labeled I is a monochromatic light beam focused on the wafer by the inverse microscope used in the projection mask printing process. The light has passed through a patterned mask and is used to transfer the pattern to the wafer by exposing the layer of photoresist 3. $I_1$ is that part of the beam that is transmitted through the antireflection layer into the insulating layer, while $I_2$ is that part of the incident beam that is reflected from the antireflection layer. (If the antireflection layer is thin relative to the wavelength of the light, then it is convenient to consider the waves reflected from the top and bottom surfaces of the antireflection layer as a single combined reflection labeled $I_2$ in FIG. 2.) $I_3$ is that part of $I_1$ reflected from the boundary between the substrate 1 and the insulating layer 2, and $I_4$ is that fraction of $I_3$ transmitted through the antireflection layer back into the layer of photosensitive material. The part of $I_3$ reflected back into the insulating layer at the boundary between the insulating and antireflection layers is labeled $I_5$, while $I_6$ represents that part of $I_5$ reflected from the substrate-insulating boundary. Finally, $I_7$ is that part of $I_6$ transmitted back through the antireflection layer into the photosensitive layer. Only first and second order reflections are considered here, since higher order reflections have only negligible amplitudes relative to the first two. In the photoresist layer then, there is an incident wave, I, travelling toward the antireflection layer, and a reflected wave which is the sum of $I_2$, $I_4$ and $I_7$ travelling away from the substrate material of the wafer.

To eliminate the reflected wave in the photoresist layer the amplitude and phase relations among the waves $I_2$, $I_4$ and $I_7$ must be chosen so that the interference among these waves results in complete cancellation. This may be accomplished by choosing the thickness $h_2$ of the insulating layer to make $I_4$ 180 ° out of phase with $I_2$, thereby putting $I_7$ almost in phase with $I_2$. The equations governing the phase changes of the reflected waves are known in the art and can be found in the *American Institute of Physics Handbook*, Second Edition, 1963, at pages 6–104, 6–105 , equations $6g$–1 through $6g$–6. Using the same equations, the thickness $h_1$ of the antireflection layer is then chosen so that the amplitude of the wave $I_4$ is equal to the sum of the amplitudes of the waves $I_2$ and $I_7$. Since $I_4$ is 180 ° out of phase with $I_2$ and $I_7$, complete cancellation will occur among these three waves, and no light will be reflected back into the photoresist layer. The photoresist will then be exposed uniformly by the incoming wave I only.

Figure 3:
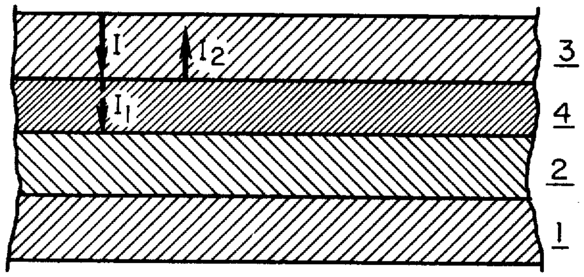
FIG. 3 is a cross-sectional view illustrating another preferred embodiment of the present invention, in which an antireflection layer is used to absorb a large fraction of light incident on it.

Referring now to FIG. 3, which illustrates another embodiment of the present invention, the solid arrow labeled I represents a light wave incident on a photosensitive layer 3, while the broken arrow $I_1$ represents a fraction of I absorbed by layer 4 which is opaque to the wavelength of the incident light and which may comprise several different materials deposited sequentially. The region 2 is an insulating layer, and the region 1 is the wafer substrate. In this embodiment of the invention, the opaque layer is sufficiently thick and light absorbing that a large fraction of the incident light is absorbed in the layer, while only a small fraction $I_2$ is reflected back into the photosensitive layer. Although this reflected light will still optically interfere with the incident light in the photosensitive region, the great disparity between the amplitude of the reflected light and the amplitude of the incident light will result in a substantially more uniform exposure than in the prior art. The advantage of using a thick absorbing layer as in this embodiment of the invention is that the reduction of the amplitude of the reflected wave does not depend on the thickness of the insulating layer below it, so that this method can be used in cases where it would be difficult to control the thickness of that layer.

We claim:

1. A method of preparing a substrate for transfer of a pattern to said substrate from a mask imprinted with said pattern, said method comprising:

depositing an insulating layer of one or more solid insulating materials onto said substrate;

depositing an antireflection layer of one or more solid materials onto said insulating layer; and depositing a layer of photosensitive material onto said antireflection layer, the thickness of said antireflection layer and the thickness of said insulating layer being chosen to achieve cancellation among light waves reflected back into said photosensitive layer from the other layers.

2. A method as in claim 1 wherein the thickness of said insulating layer is chosen so that in the photosensitive layer a first light wave reflected from the boundary between said substrate and said insulating layer will be 180 ° out of phase with a second light wave reflected from said antireflection layer back into said layer of photosensitive material, and the thickness of said antireflection layer is chosen so that the fraction of light transmitted through it is such that in the photosensitive layer the amplitude of said first wave will be equal to the combined amplitudes of said second wave and a third wave reflected a second time from the substrate-insulator boundary after having been reflected once from the substrate-insulator boundary back to said antireflection layer and thence from said antireflection layer to the substrate-insulator boundary.

3. A method as in claim 1 wherein:

the material comprising said substrate is one of the group consisting of silicon, germanium, gallium arsenide, tantalum nitride, molybdenum, and epitaxially grown germanium on gallium arsenide;

the materials comprising said insulating layer are from the group consisting of silicon dioxide ($SiO_2$), sputtered quartz, silicon nitride ($Si_3N_4$), aluminum oxide ($Al_2O_3$), silicon monoxide ($SiO$); and the materials comprising said antireflection layer are from the group consisting of molybdenum, chromium, gold, aluminum, nickel, or tantalum nitride.

* * * * *